United States Patent [19]
Nishimura

[11] Patent Number: 6,049,903
[45] Date of Patent: Apr. 11, 2000

[54] DIGITAL DATA ERROR DETECTION AND CORRECTION SYSTEM

[75] Inventor: Hiroshi Nishimura, Tokyo, Japan

[73] Assignee: Kabushiki Kaisha Toshiba, Kawasaki, Japan

[21] Appl. No.: 08/935,106

[22] Filed: Sep. 29, 1997

[30] Foreign Application Priority Data

Sep. 30, 1996 [JP] Japan .................................. 8-278879

[51] Int. Cl.[7] .......................... H03M 13/00; G06F 11/00
[52] U.S. Cl. ........................... 714/752; 714/798; 714/758
[58] Field of Search ..................................... 714/776, 758, 714/752, 798, 807, 788, 762

[56] References Cited

U.S. PATENT DOCUMENTS

| | | | |
|---|---|---|---|
| 4,677,623 | 6/1987 | Iwasaki et al. | 714/762 |
| 5,136,592 | 8/1992 | Weng | 714/762 |
| 5,367,544 | 11/1994 | Bruekheimer | 375/368 |
| 5,807,413 | 2/1999 | Kodama et al. | 714/758 |
| 5,867,509 | 2/1999 | Tanaka | 714/758 |
| 5,878,057 | 3/1999 | Maa | 714/757 |

*Primary Examiner*—Albert De Cady
*Assistant Examiner*—Shelly A Chase
*Attorney, Agent, or Firm*—Oblon, Spivak, McClelland, Maier & Neustadt, P.C.

[57] ABSTRACT

A CRC coding circuit performs an operation of division of a receive polynomial $Yh(x)$ indicating received data corresponding to input effective bits by the CCITT CRC-16 generating polynomial $G(x)$ to form the residual polynomial $Sh(x)$. The residual polynomial (the bit outputs of delay elements S0 to S15) is input to a CRC inversion operation circuit on a parallel-by-bit basis. The CRC inversion operation circuit, which is identical in arrangement to but opposite in data shift direction to the CRC coding circuit, multiplies the residual polynomial $Sh(x)$ by $x^{-1}$, then divides the result by the generating polynomial $G(x)$, thereby detecting an error in the received data.

10 Claims, 5 Drawing Sheets

DIGITAL DATA ERROR DETECTION AND CORRECTION SYSTEM

BACKGROUND OF THE INVENTION

The present invention relates to an error detecting circuit for detecting an error in received digital data containing a CRC (cyclic redundancy check) code.

In addition, the present invention relates to an error correcting circuit for correcting an error in received digital data containing a CRC code.

Moreover, the present invention relates to an error detecting method for detecting an error in received digital data containing a CRC code.

Furthermore, the present invention relates to an error correcting method for correcting an error in received digital data containing a CRC code.

Conventionally, in digital communications, a CRC code, such as CCITT CRC-16, is produced from transmit data and then added to the transmit data for transmission. On the receive side, an error in received data is corrected by means of an error trap method using the CRC code contained in the received data, thereby improving data transmission quality.

FIG. 1 shows a conventional error correcting circuit which uses the error trap method that corrects a single-bit error using a CCITT CRC-16-based CRC code. The error correcting circuit comprises a CRC coding circuit 10, a NOR circuit 20, an AND circuit, and a cyclic unit time delay circuit 40.

The CRC coding circuit 10, which is provided with a shift register consisting of 16 delay elements S0 to S15, divides received data represented by a receive polynomial Y(x) by the CRC generating polynomial G(x) of CCITT CRC-16 to obtain a residual polynomial S(x).

Assume here that transmit data is represented by a code polynomial W(x) and a single-bit error, $E(x)=x^i$, has occurred in the transmit data during transmission. Then, the receive polynomial Y(x) will be represented by $$Y(x)=W(x)+x^i \quad (1)$$

Coding by the CRC coding circuit 10 (division by the CRC generating polynomial G(x)) on the received data represented by the polynomial Y(x) forms a residual polynomial S(x) represented by $$S(x)=[Y(x)]\mathrm{mod}G(x)=[x^i]\mathrm{mod}G(x) \quad (2)$$

Assuming here that i<degree G(x)=m, it is evident that the residual polynomial S(x) is $x^i$. That is, the residual polynomial S(x) indicates an error polynomial (single-bit error).

When i≧m, received data as shown in FIG. 2 is entered into the CRC coding circuit 10 to form a residual polynomial S(x). After that, 0s following the received data are entered into the CRC coding circuit until a single-bit error appears. Thus, cyclic replacement is made to detect and correct a single-bit error in the received data.

However, the error correction by the conventional error correcting circuit thus arranged requires calculations that correspond in number to the period generated by a shift register for the CRC generating polynomial irrespective of the length of received data, resulting in an increased delay time and consequently in an obstacle to real-time data communications.

To solve these problems, a parallel operation circuit has been used to reduce the calculation time. However, the use of the parallel operations circuit results in an increase in circuit scale.

With the conventional error detecting and correcting circuit, there occurs a delay that corresponds to the period of a CRC generating polynomial irrespective of the length of received data, resulting in an increase in the time required for error detection and correction. When a parallel operation circuit is used to solve this problem, a new problem will arise in that the circuit scale increases.

BRIEF SUMMARY OF THE INVENTION

It is an object of the present invention to provide an error detecting circuit which permits the time it takes to detect an error to be reduced without increasing the circuit scale.

It is another object of the present invention to provide an error detecting method which permits the time it takes to detect an error to be reduced without increasing the circuit scale.

It is still another object of the present invention to provide an error correcting circuit which permits the time it takes to correct an error to be reduced without increasing the circuit scale.

It is a further object of the present invention to provide an error detecting method which permits the time it takes to correct an error to be reduced without increasing the circuit scale.

According to a first aspect of the present invention, there is provided an error detecting circuit comprising: calculation means for calculating a residual term Sh(x) obtained by dividing a polynomial Yh(x) representing effective bits contained in a receive polynomial Y(x) representing received data by a CRC generating polynomial G(x); and detecting means for detecting an erroneous bit by repeating operations of multiplying the residual term Sh(X) obtained by the calculation means by $x^{-1}$, then dividing the result by the CRC generating polynomial.

According to a second aspect of the present invention, in the error detecting circuit according to the first aspect, the calculation of the residual term by the calculation means is made in synchronism with a first clock signal, and the detection of an erroneous bit by the detecting means is made in synchronism with a second clock signal faster than the first clock signal.

According to a third aspect of the present invention, in the error detecting circuit according to the first aspect, the effective bits contain bits of data and CRC check bits for the bits of data.

According to a fourth aspect of the present invention, there is provided an error correcting circuit comprising: calculation means for calculating a residual term Sh(x) obtained by dividing a polynomial Yh(x) representing effective bits contained in a receive polynomial Y(x) representing received data by a CRC generating polynomial G(x); detecting means for detecting an erroneous bit by repeating operations of multiplying the residual term Sh(X) obtained by the calculation means by $x^{-1}$, then dividing the result by the CRC generating polynomial; and correction means for correcting the erroneous bit when it is detected by the detecting means.

According to a fifth aspect of the present invention, in the error correcting circuit according to the fourth aspect, the calculation of the residual term by the calculation means is made in synchronism with a first clock signal, and the detection of an erroneous bit by the detecting means is made in synchronism with a second clock signal faster than the first clock signal.

According to a sixth aspect of the present invention, in the error detecting circuit according to the fourth aspect, wherein the effective bits contain bits of data and CRC check bits for the bits of data.

According to a seventh aspect of the present invention, in the error detecting circuit according to the fourth aspect, the correction of the erroneous bit by the correcting means is made in synchronism with a clock signal used by the detecting means to detect the erroneous bit.

According to an eighth aspect of the present invention, in the error detecting circuit according to the fourth aspect, the detecting means produces a detect signal when an erroneous bit is detected, and the correcting means comprises a shift register into which at least the effective bits of received data are read and from which they are output in the opposite order to that in which they were read into, and second correcting means for correcting the erroneous bit contained in the received data on the basis of the received data output from the shift register and the detect signal output from the detecting means.

According to a ninth aspect of the present invention, in the error correcting circuit according to the eighth aspect, the shift register further comprises means for outputting bits of received data corrected by the second correcting means in the order in which they were read into.

According to a tenth aspect of the present invention, in the error correcting circuit according to the fourth aspect, the correcting means comprises storage means for storing at least the effective bits of received data, position detecting means for detecting the position of the erroneous bit in the received data, and correcting means for correcting the erroneous bit in the effective bits of received data stored in the storage means on the basis of the position of the erroneous bit detected by the position detecting means.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
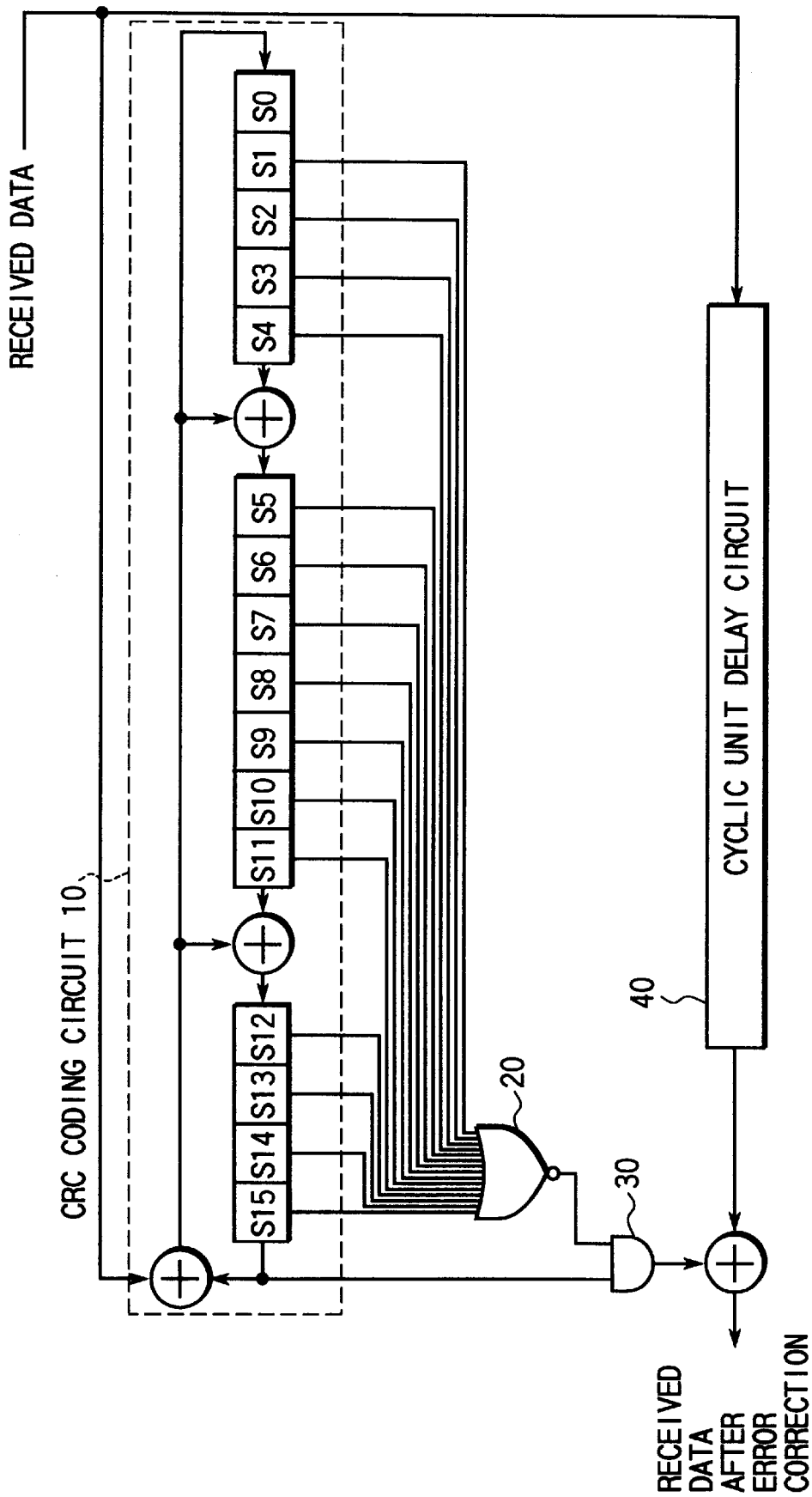
FIG. 1 is a circuit block diagram of a conventional error correcting circuit.

In the present invention, the residual term $Sh(x)$ obtained by dividing a polynomial $Y_h(x)$ having elements each corresponding to a respective one of effective bits in an incoming signal by a CRC generating polynomial $G(x)$ is multiplied by $x^{-1}$, then divided by the CRC generating polynomial $G(x)$. This operation processing is repeated to find the position of a bit in error.

Hereinafter, the principle of the above operation processing for detecting the position of a bit in error will be described.

The present invention is based on the fact that the receive polynomial $Y(x)$ used in the error trapping method described previously in "BACKGROUND OF THE INVENTION" is formed by appending k number of 0s to a polynomial $Y_h(x)$ corresponding to received effective bits of data so that $Y(x)$ corresponds in bit sequence length to the CRC generating polynomial.

First, let transmit data be represented by a polynomial code $W(x)$ and an error polynomial by $E(x)$. Then, the residual polynomial $S(x)$ obtained by the error trapping method is $$S(x) = [Y(x)]\, mod\, G(x) \quad (3)$$
$$= [W(x) + E(x)]\, mod\, G(x)$$
$$= E(x)\, mod\, G(x)$$

Next, let receive data with effective bits be represented by a polynomial $Yh(x)$ and an error polynomial by $E(x)$. Then, the residual polynomial $Sh(x)$ obtained in the invention is $$S_h(x) = [Y_h(x)]mod G(x) \quad (4)$$

Since the polynomial $Yh(x)$ is the product of the receive polynomial $Y(x)$ and $x^{-k}$, $$S_h(x) = [x^{-k}[Y(x)]\, mod\, G(x) \quad (5)$$
$$= [x^{-k}E(x)]\, mod\, G(x)$$

Since, as described previously, the receive polynomial $Y(x)$ used in the error trapping method is formed by appending k successive 0s to the receive polynomial $Yh(x)$, the residual polynomial $S'(x)$ formed by dividing the product of the residual polynomial $S(x)$ in the error trapping method and $x^{-k}$ by the CRC generating polynomial $G(x)$ becomes $$S'(x)=[x^{-k}E(x)]mod G(x) \quad (6)$$

Thus, $$S_h(x)=S'(x) \quad (7)$$

For this reason, by repeating operations processing of seeking the residual term $Sh(x)$, and multiplying $Sh(x)$ by $x^{-1}$, then dividing the result by the CRC generating polynomial $G(x)$, the position of a bit in error can be detected as with the conventional error trapping method.

According to the present invention, therefore, by repeating operations, at a maximum, a number of times corresponding to the number of effective bits, the position of a bit in error can be detected. The error detection and correction can thus be made in a short time.

Hereinafter, the preferred embodiments of the present invention will be described with reference to the drawings.

Figure 3:
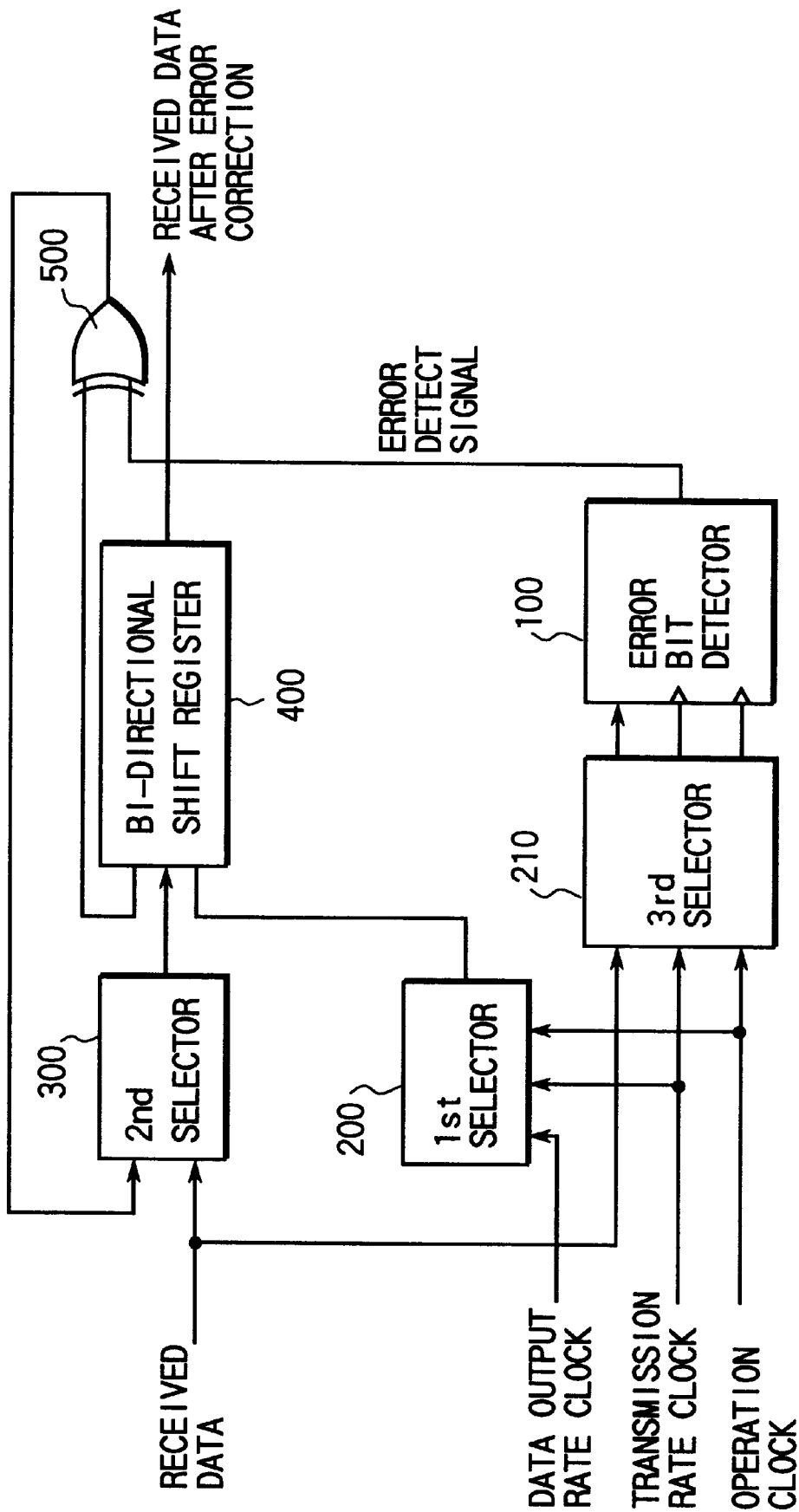
FIG. 3 is a circuit block diagram of an error correcting circuit according to a first embodiment of the present invention.

FIG. 3 shows an arrangement of an error correcting circuit according to a first embodiment of the present invention, which comprises an erroneous bit detecting circuit 100, a first selector 200, a second selector 300, a third selector 210, a bi-directional shift register 400, and an error corrector 500.

Figure 4:
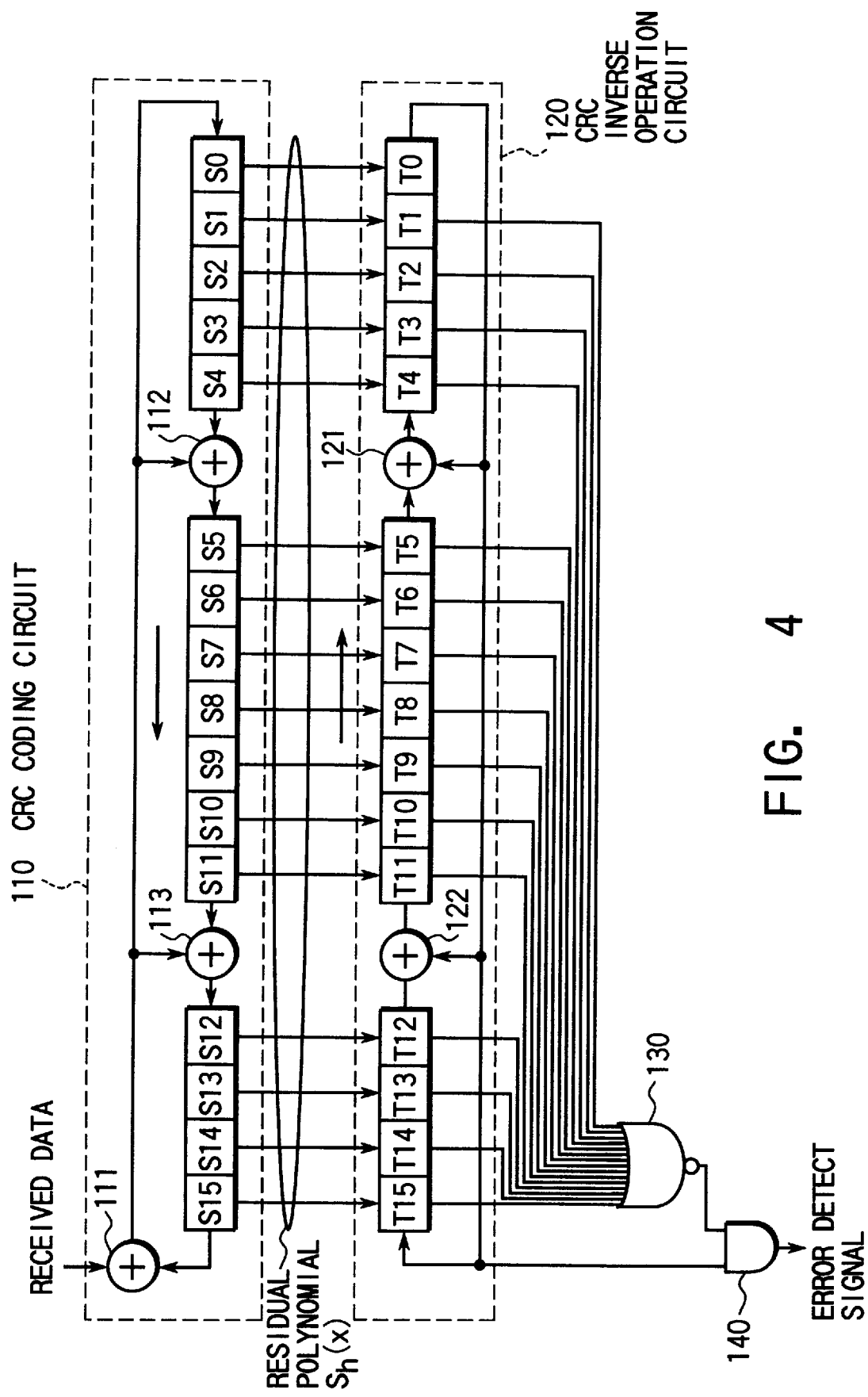
FIG. 4 is a circuit block diagram of the erroneous bit detecting circuit in the error correcting circuit of FIG. 3.

The erroneous bit detecting circuit 100, adapted to detect an erroneous bit in received data, consists, as shown in FIG. 4, of a CRC coding circuit 110, a CRC inverse operation circuit 120, a NOR circuit 130, and an AND circuit 140.

The erroneous bit detecting circuit 100 is connected to receive a signal selected by the selector 210 from among received data, a transmission rate clock signal, and a clock signal for operations. Here, the case where the CCITT CRC-16 code is used will be described by way of example.

The CRC coding circuit 110, which performs an operation based on the CCITT CRC-16 generating polynomial G(x) on the receive polynomial Yh(x) corresponding to effective bits in received data to obtain the residual polynomial Sh(x), comprises EX-OR gates 111, 112, and 113, and delay elements S0 to S15.

The EX-OR gate 111 receives at its first input the received data and at its second input the output of the delay element S15 to be described later. The output of the EX-OR gate 111 is applied to the first input of each of the EX-OR gates 112 and 113 and the delay element S0. The delay elements S0 to S15 are connected in cascade so that the output of each delay element is shifted in the direction that the subscript numbers of the respective delay elements increase.

The EX-OR gate 112 is connected between the delay elements S4 and S5, and the EX-OR gate 113 is connected between the delay elements S11 and S12. More specifically, the EX-OR gate 112 has its first input connected to the output of the EX-OR gate 111, its second input connected to the output of the delay element S4, and its output connected to the input of the delay element S5. Likewise, the EX-OR gate 113 has its first input connected to the output of the EX-OR gate 111, its second input connected to the output of the delay element S11, and its output connected to the input of the delay element S12.

Figure 2:
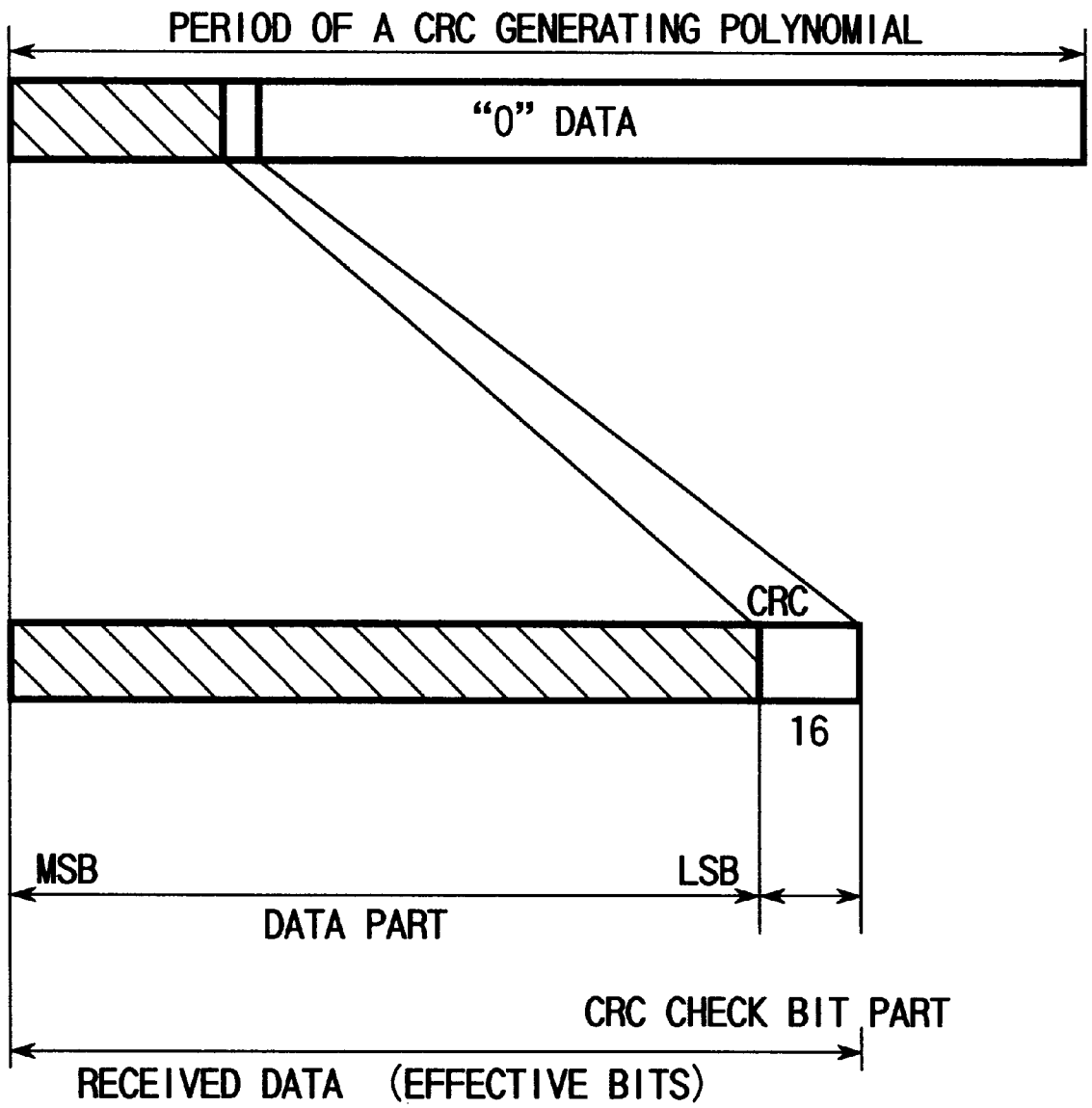
FIG. 2 shows a signal format in digital communications using the CCITT CRC-16 as a CRC code.

The CRC coding circuit 110 thus arranged performs an operation based on a generating polynomial G(x) on received data of effective bits (the data part plus the CRC check bit part as shown in FIG. 2) to obtain the residual polynomial Sh(x). This residual polynomial, which consists of the bit outputs of the respective delay elements S0 to S15, is applied to the CRC inverse operation circuit 120 on a parallel-by-bit basis.

The CRC inverse operation circuit 120, arranged to multiply the residual polynomial Sh(x) by $x^{-1}$ and then divide the result by the generating polynomial G(x) to thereby detect an error in the received data, comprises EX-OR gates 121 and 122 and delay elements T0 to T15. This operation circuit is identical in arrangement to the CRC coding circuit 110 except the direction in which data bits are shifted.

Each of the delay elements T0 to T15 is connected to receive the bit output of a corresponding one of the delay elements S0 to S15 the outputs of which indicate the residual polynomial Sh(x). The delay elements T0 to T15 are connected in cascade so that bits of data are shifted through them in the direction that the subscript numbers decrease. That is, the shifting direction in the CRC inverse operation circuit 120 is opposite to that in the CRC coding circuit 110.

The delay element T0 has its output connected to a first input of each of the EX-OR gates 121 and 122 and to the input of the delay element T15.

The EX-OR gate 121 is connected between the delay elements T4 and T5, and the EX-OR gate 122 is connected between the delay elements T11 and T12. More specifically, the EX-OR gate 121 has its first input connected to the output of the delay element T0, its second input connected to the output of the delay element T5, and its output connected to the input of the delay element T4. Likewise, the EX-OR gate 122 has its first input connected to the output of the delay element T0, its second input connected to the output of the delay element T12, and its output connected to the input of the delay element T11.

In the CRC inverse operation circuit 120 thus arranged, with each shift of data, the output of the delay element T0 is applied to a first input of the AND circuit 140 and the outputs of the respective delay elements T1 to T15 are applied to the NOR circuit 130.

When the outputs of the respective delay elements T1 to T15 are all 0s (i.e., there is no error), the NOR circuit 130 provides a 1 to a second input of the AND circuit 140.

When the output of the delay element T0 is a 1 (i.e., there is an error) and that the output of the NOR circuit 130 is a 1, the AND circuit 140 outputs a 1.

That is, when a bit in error appears in a predetermined position (the delay element T0 in this example), the CRC inverse operation circuit 120 outputs a 1 as an error detect signal, which, in turn, is applied to the error corrector 500.

Referring back to FIG. 3, the first selector 200 selects one from among a data output rate clock signal, the transmission rate clock signal, and the operation clock signal and then applies it to the bi-directional shift register 400.

The second selector 300 selects either the received data or data that has been corrected by the error corrector 500 and applies the selected one to the bi-directional shift register 400.

The bi-directional shift register 400 is a shift register arranged such that it can store only the effective bits of received data applied thereto via the second selector 300 and output stored data in two directions (in the order in which they were read into or in the reverse order) according to the transmission rate clock signal from the first selector 200.

The error corrector 500 consists of, for example, an EX-OR gate and, when an error detect signal from the erroneous bit detecting circuit 100 is made a 1, inverts each bit of data output from the bi-directional shift register 400 in the opposite order to that in which they were read into, thereby making correction on the received data.

The operation of the error correction circuit will be described below.

Received data from the receiving section not shown is applied to the erroneous bit detecting circuit 100 via the third selector 210 based on the transmission rate clock signal and to the bi-directional shift register 400 via the second selector 300.

In the erroneous bit detecting circuit 100, the received data is entered into the CRC coding circuit 110 by the transmission rate clock signal to form the residual polynomial Sh(x) for the received data Yh(x) which, of data over the period of the generating polynomial as shown in FIG. 2, correspond to the effective bits. Each of bits that form the residual polynomial Sh(x) (outputs of the respective delay elements S0 to S15) is entered into a corresponding one of the delay elements T0 to T15 in the CRC inverse operation circuit 120.

In the CRC inverse operation circuit 120, the bits of data which have been input in parallel from the CRC coding circuit 110 are circulated in the opposite direction to that in the CRC coding circuit 110 using the operation clock signal faster than the transmission rate clock signal, thereby detecting a bit in error.

Concurrently with the erroneous bit detection, the bi-directional shift register 400 sequentially outputs the bits of the received data temporarily read into it to the error corrector 500 using the operation clock signal in the opposite order to that in which they were input.

That is, the outputting of the received data from the bi-directional shift register 400 and the error detection in the erroneous bit detecting circuit 100 are performed in synchronism with the operation clock signal.

For this reason, the erroneous bit detecting circuit 100 detects an error at the same time an erroneous bit of data is output from the bi-directional shift register 400. Thus, the erroneous bit will be corrected in the error corrector 500.

The received data output from the bi-directional shift register 400 is subjected to error correction in the error corrector 500 in that manner, then re-entered into that shift register via the second selector 300.

When, in this manner, a circular shift of the effective bits of received data read into the bi-directional shift register 400 is completed with the erroneous bit corrected, the effective bits are output by the data output rate clock signal to the succeeding signal processing section (not shown) in the order in which they were read into.

Thus, in the error correcting circuit thus arranged, the residual polynomial Sh(x) for received data Yh(x) corresponding to the effective bits is obtained using the generating polynomial G(x). The residual polynomial Sh(x) is multiplied by $x^{-1}$, then divided by the generating polynomial G(x). This operation processing is repeated. Thereby, the error detection is made for the effective bits of received data in the opposite direction to that in which they were received and then the error correction is made for the bit in error.

According to the error correction circuit, therefore, after the formation of the residual polynomial Sh(x), the error detection and correction can be made with clocks that correspond in number to the effective bits of received data, helping reduce the time it takes to make error correction considerably in comparison with the conventional circuit.

Conventionally, an echo suppression circuit has been used to eliminate echoes resulting from delay. The reduction in delay time eliminates the need of such a circuit, allowing the circuit scale to be reduced. In addition, since no parallel operation circuit is used, the circuit scale will be further reduced.

A second embodiment of the present invention will be described below with reference to FIG. 5.

Figure 5:
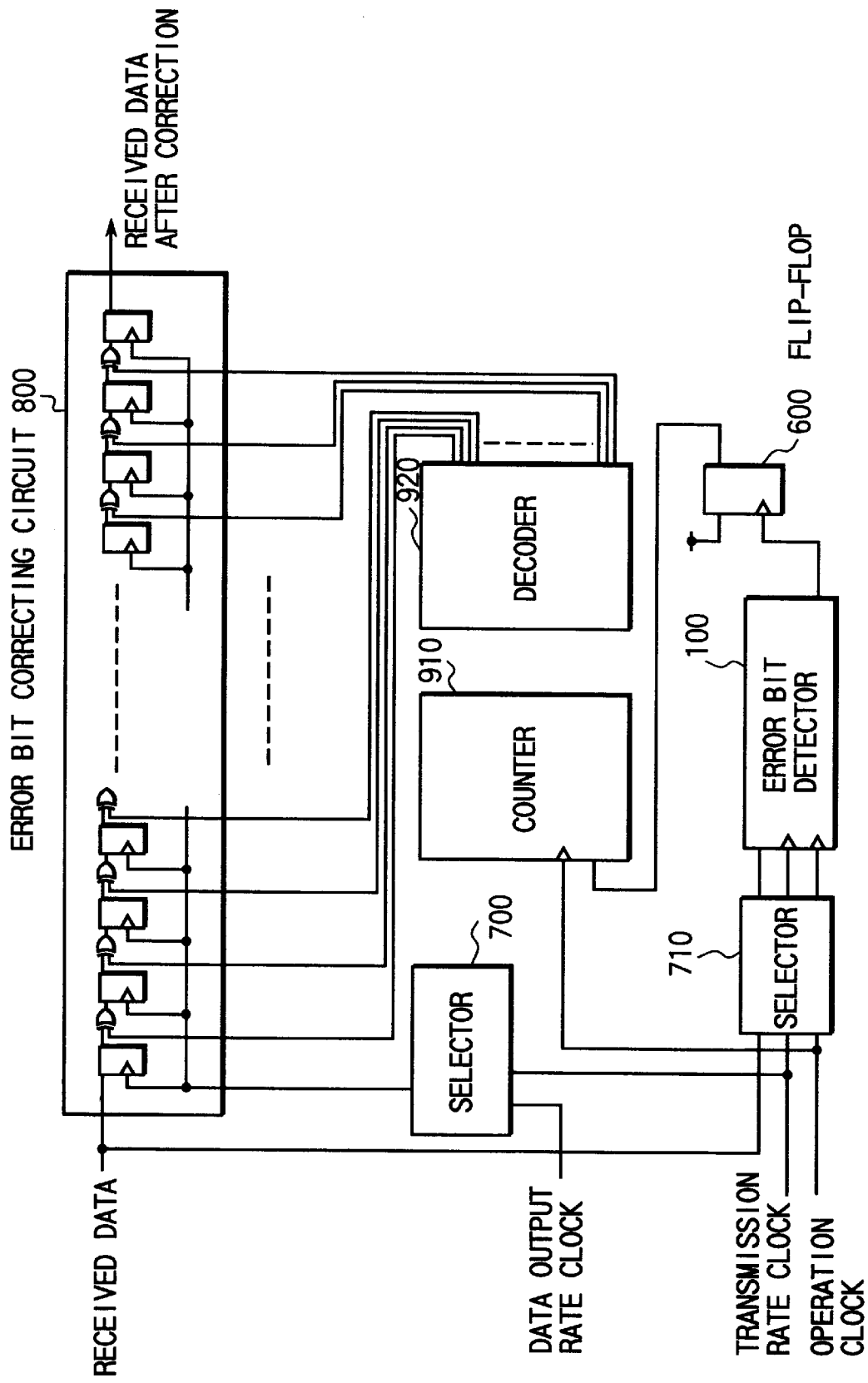
FIG. 5 is a circuit block diagram of an error correcting circuit according to a second embodiment of the present invention.

An error correcting circuit shown in FIG. 5 comprises the above-described erroneous bit detecting circuit 100, selectors 700 and 710, an erroneous bit correcting circuit 800, a counter 910, and a decoder 920.

As in the first embodiment, the erroneous bit detecting circuit 100 is supplied with a signal which is selected by the selector 710 from among received data, a transmission rate clock signal, and an operation clock signal to detect a bit in error in the received data. A signal indicating the detection of an erroneous bit is output from the erroneous bit detecting circuit 100 through the synchronizing flip-flop 600 to the counter 910.

The selector 700 is supplied with a data output rate clock signal and the transmission rate clock signal and selects one of them for entry into the erroneous bit correcting circuit 800.

The erroneous bit detecting circuit 800 is a buffer circuit in which D flip-flops the number of which is equal to that of effective bits are connected in series with an EX-OR gate for inverting input data interposed between each flip-flop. The inputting or outputting of received data into or from the buffer circuit is performed based on the transmission rate clock signal or the data output rate clock signal from the selector 700. Each of the EX-OR gates is supplied with an inversion control signal from the decoder 920 when required.

The counter 910, which, as described previously, is supplied with an error detect signal from the erroneous bit detecting circuit 100 via the flip-flop 600, counts the number of operation clocks required during the time interval that elapses from the start of an error detecting operation until an error is detected.

The decoder 920 decodes a count of operation clocks obtained by the counter 910 to find that D flip-flop which stores the erroneous bit. An inversion control signal is then applied to the EX-OR gate associated with that flip-flop.

The operation of the error correcting circuit thus arranged will be described below.

Received data from the receive section not shown is applied to the erroneous bit detecting circuit 100 and the erroneous bit correcting circuit 800 by the transmission rate clock signal.

As described in connection with the first embodiment, the erroneous bit detecting circuit 100 detects an erroneous bit in received data using the operation clock signal faster than the transmission rate clock signal.

At this point, the counter 100 counts the number of operation clocks required during the time interval that elapses from the start of an erroneous bit detecting operation by the erroneous bit detecting circuit 100 until an error is detected and then provides the result to the decoder 920. In response to this, the decoder 920 decodes the count of operation clocks in the counter to find the D flip-flop that stores the erroneous bit.

Upon termination of the erroneous bit detecting operation by the erroneous bit detecting circuit 100, the selector 700 applies the data output clock signal to each D flip-flop in the erroneous bit correcting circuit, allowing the effective bits of the received data to be output.

At the same time, an inversion control signal is applied to the EX-OR gate associated with that D flip-flop which stores the erroneous bit. Thereby, the erroneous bit of data is inverted, so that error correction is made.

As described above, the error correcting circuit thus arranged identifies the position of the erroneous bit on the basis of the number of operation clocks required during the time interval that elapses from the start of an erroneous bit detecting operation by the erroneous bit detecting circuit 100 until an error is detected and then makes error correction on the received data stored in the erroneous bit correcting circuit 800. Even with such an erroneous bit correcting circuit, as with the first embodiment, the time required for erroneous bit detection and correction can be reduced.

Although the embodiments have been described as using the CCITT CRC-16 generating polynomial for single-bit error correction, other CRC generating polynomials having error correcting ability can be used with the same results. Further, the single-bit error correction is merely exemplary. The present invention may be applied to double- or more-bit error correction.

The present invention may be practiced or embodied in still other ways without departing the scope and spirit thereof.

As described above, according to the present invention, a polynomial Yh(x) for effective bits in received data is divided by a generating polynomial G(x) to obtain the residual polynomial Sh(x) and then operations of multiplying the Sh(x) by $x^{-1}$ and then dividing the result by the generating polynomial G(x) are repeated to find the position of an erroneous bit.

According to the present invention, therefore, to detect the position of an erroneous bit, it is necessary only that calculations be made a number of times which, at a maximum, corresponds to the number of effective bits in received data. In contrast, in the conventional system, it is required that calculations be made a number of times corresponding to the period of the CRC generating polynomial.

For this reason, an error detecting circuit and an error correction circuit can be provided which permit the time required for error detection and correction to be reduced with no increase in the circuit scale unlike the case where a parallel operation circuit is used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

I claim:

1. An error correcting circuit comprising:

calculation means for calculating a residual term $Sh(x)$ obtained by dividing a polynomial $Yh(x)$ representing effective bits contained in a receive polynomial $Y(x)$ representing received data by a CRC generating polynomial $G(x)$;

detecting means for detecting an erroneous bit by repeating operations of multiplying the residual term $Sh(X)$ obtained by the calculation means by $x^{-1}$ and of dividing the result by the CRC generating polynomial; and first correction means for correcting the erroneous bit in case where the erroneous bit is detected by the detecting means, wherein the detecting means outputs a detect signal when the erroneous bit is detected, and wherein the first correction means comprises a shift register into which at least the effective bits of received data are read and from which the effective bits are output in the opposite order to that in which the effective bits are read into, and second correction means for correcting the erroneous bit contained in the received data on the basis of the received data output from the shift register and the detect signal output from the detecting means.

2. The error correcting circuit according to claim 1, wherein the calculation of the residual term by the calculation means is made in synchronism with a first clock signal, and the detection of an erroneous bit by the detecting means is made in synchronism with a second clock signal faster than the first clock signal.

3. The error correcting circuit according to claim 1, wherein the effective bits contain bits of data and CRC check bits for the bits of data.

4. The error correcting circuit according to claim 1, wherein the correction of the erroneous bit by the correction means is made in synchronism with a clock signal used by the detecting means to detect the erroneous bit.

5. The error correcting circuit according to claim 1, wherein the shift register further comprises means for outputting the received data corrected by the second correcting means in the order in which the received data are read into.

6. The error correcting circuit according to claim 1, wherein the correcting means comprises storage means for storing at least the effective bits of received data, position detecting means for detecting the position of the erroneous bit in the received data, and correcting means for correcting the erroneous bit in the effective bits of received data stored in the storage means on the basis of the position of the erroneous bit detected by the position detecting means.

7. An error correcting method comprising the steps of:

calculating a residual term $Sh(x)$ obtained by dividing a polynomial $Yh(x)$ representing effective bits contained in a receive polynomial $Y(x)$ representing received data by a CRC generating polynomial $G(x)$;

detecting an erroneous bit by repeating operations of multiplying the residual term $Sh(X)$ obtained by the step of calculation by $x^{-1}$ and of dividing the result by the CRC generating polynomial; and correcting the erroneous bit in case where the erroneous bit is detected, wherein the step of detecting outputs a detect signal when the erroneous bit is detected, and wherein the step of correcting further comprises reading at least the effective bits of received data into a shift register and outputting the effective bits from the shift register in the opposite order to that in which the effective bits are read into the shift register, and correcting the erroneous bit contained in the received data on the basis of the received data output from the shift register and the detect signal output from the step of detecting.

8. The error correcting method according to claim 7, wherein the residual term is calculated in synchronism with a first clock signal, and the erroneous bit is detected in synchronism with a second clock signal faster than the first clock signal.

9. The error correcting method according to claim 7, wherein the effective bits contain bits of data and CRC check bits for the bits of data.

10. The error correcting method according to claim 7, wherein the correction of the erroneous bit is made in synchronism with a clock signal used to detect the erroneous bit.

* * * * *